(12) United States Patent
Matsuda et al.

(10) Patent No.: US 11,589,505 B2
(45) Date of Patent: Feb. 28, 2023

(54) HOUSING AND ELECTRIC MOWER

(71) Applicant: Kubota Corporation, Osaka (JP)

(72) Inventors: Kazuaki Matsuda, Sakai (JP); Hirokazu Ito, Sakai (JP)

(73) Assignee: Kubota Corporation, Osaka (JP)

( * ) Notice: Subject to any disclaimer, the term of this patent is extended or adjusted under 35 U.S.C. 154(b) by 332 days.

(21) Appl. No.: 16/895,591

(22) Filed: Jun. 8, 2020

(65) Prior Publication Data

US 2021/0068341 A1   Mar. 11, 2021

(30) Foreign Application Priority Data

Sep. 9, 2019   (JP) .............................. JP2019-163700

(51) Int. Cl.
    *A01D 34/81*    (2006.01)
    *A01D 34/64*    (2006.01)
    *A01D 34/78*    (2006.01)

(52) U.S. Cl.
    CPC .............. *A01D 34/81* (2013.01); *A01D 34/64* (2013.01); *A01D 34/78* (2013.01)

(58) Field of Classification Search
    CPC ........ A01D 34/81; A01D 34/64; A01D 34/78; H01M 10/653; H01M 10/652
    USPC ........................................................ 56/14.7
    See application file for complete search history.

(56) References Cited

U.S. PATENT DOCUMENTS

| | | | |
|---|---|---|---|
| 2006/0087210 A1 | 4/2006 | Kim et al. | |
| 2013/0176730 A1* | 7/2013 | Kijima ................... | G03B 21/16 362/249.01 |
| 2014/0017521 A1* | 1/2014 | Suzuki .................. | H01M 50/24 429/7 |
| 2016/0093849 A1* | 3/2016 | DeKeuster ............ | H01M 50/20 429/61 |
| 2017/0115211 A1* | 4/2017 | Morimoto ............ | G01N 21/359 |
| 2017/0301965 A1* | 10/2017 | Kato ....................... | F16L 59/00 |
| 2018/0241017 A1 | 8/2018 | Nakamura et al. | |
| 2018/0301773 A1* | 10/2018 | Sugiyama ........... | H01M 10/625 |
| 2018/0345778 A1* | 12/2018 | Yamanaka ............. | B62D 21/02 |
| 2019/0207179 A1* | 7/2019 | Sugiyama ........... | H01M 10/653 |
| 2019/0296303 A1 | 9/2019 | Sueyoshi et al. | |

FOREIGN PATENT DOCUMENTS

| | | |
|---|---|---|
| EP | 3333934 A1 | 6/2018 |
| JP | 2000295721 A | 10/2000 |
| WO | 2018116715 A1 | 6/2018 |

* cited by examiner

*Primary Examiner* — Hau V Phan

(74) *Attorney, Agent, or Firm* — The Webb Law Firm

(57) ABSTRACT

A housing holding parts includes a plurality of outer circumferential plates connected with each other to form a first enclosed space, one or more of the outer circumferential plates having a total of two or more outer holes formed therein, and a gutter member connected to at least two outer circumferential plates, the gutter member having an inner hole formed therein, wherein a second enclosed space is formed by the outer circumferential plates and the gutter member, the outer holes communicate with the second enclosed space, and the inner hole is provided to be offset from each of the lines passing through each of the outer holes which are perpendicular to the outer circumferential plates in which the outer holes 8 are formed.

6 Claims, 4 Drawing Sheets

HOUSING AND ELECTRIC MOWER

CROSS-REFERENCE TO RELATED APPLICATION

This claims priority to Japanese Patent Application No. 2019-163700 filed Sep. 9, 2019, the disclosure of which is hereby incorporated by reference in its entirety.

TECHNICAL FILED

The present invention relates to a housing mounted on a working machine and holding parts, and an electric mower equipped with the housing.

BACKGROUND ART

Working machines such as electric mowers are equipped with a housing holding various parts including electronic components and circuit boards. The housing has a space for holding parts therein, and for example has a rectangular parallelepiped shape made of six outer circumferential plates combined. As described in Patent Literature 1, ventilation needs to be provided for the housing in consideration of heat dissipation of parts and the like, and openings are formed in the outer circumferential plates.

Working machine may be exposed to wind and rain, and receive jetted water, for example when it is washed. At such a time, when water enters the housing, parts will get wet, which may result in a failure or malfunction of the working machine. Therefore, the housing is equipped with a mechanism to secure ventilation and to prevent water from entering.

CITATION LIST

Patent Literature

[Patent Literature 1] Japanese Patent Application Publication No. 2000-295721

SUMMARY OF INVENTION

Technical Problem

The housing needs to secure a space to hold various parts. Therefore, there has been a demand for a mechanism having a simple configuration and a capability to secure ventilation property and waterproof property.

Solution to Problem

The housing according to an embodiment of the present invention is a housing for holding parts. The housing includes: a plurality of outer circumferential plates connected with each other to form a first enclosed space, one or more of the outer circumferential plates having a total of two or more outer holes formed therein; and a gutter member connected to at least two outer circumferential plates, the gutter member having an inner hole formed therein, wherein the outer circumferential plates and the gutter member form a second enclosed space, the outer holes communicate with the second enclosed space, and the inner hole is provided to be offset from the lines passing through the respective outer holes, the lines being perpendicular to the outer circumferential plate in which the outer holes are formed.

This configuration secures ventilation property while air is allowed to circulate between the inside and the outside of the housing via the outer holes and the inner hole. The outer holes and the inner hole are provided to be offset. Therefore, water which has entered the second enclosed space from the outer holes is easily passed through the enclosed space of the gutter member and discharged from the outer holes to the outside of the housing without entering the inside of the housing from the inner hole. With the above, ventilation property and waterproof property are effectively secured with the simple configuration.

It is preferable that the outer holes are formed in the outer circumferential plate which serves as a bottom face when the housing is in use.

With this configuration, water which has entered the second enclosed space from the outer holes hardly reaches the inner hole and is easily discharged from the outer holes. As a result, ventilation property and waterproof property are effectively secured with the simple configuration.

Also, the gutter member may be disposed over two adjacent outer circumferential plates.

With this configuration, the gutter member is simply configured over the two outer circumferential plates, and is disposed at a corner part in the housing. Therefore, the gutter member can be configured with the simple configuration without occupying much space in the housing.

Also, the outer holes are preferably two holes formed in the outer circumferential plate, and the inner hole is preferably provided near a middle point between the two outer holes when viewed from a plane parallel to the outer circumferential plate in which the outer holes are formed.

With this configuration, water which has entered the second enclosed space from the outer holes is highly likely to be prevented from further entering the housing via the inner hole, and more accurately secures ventilation property and waterproof property.

Also, the inner hole may be an elongated hole along a contacting line between the outer circumferential plate and the gutter member.

With this configuration, passing through of water is easily prevented while securing flowability of air with the inner hole, and ventilation property and waterproof property are more accurately secured.

Also, a plurality of the gutter members may be provided to form the respective second enclosed spaces, the outer holes may communicate with the respective second enclosed spaces and the inner holes may communicate with the respective second enclosed spaces.

With this configuration, the number of the gutter members can be adjusted according to a required quantity of airflow, and sufficient ventilation property can be easily secured while waterproof property is secured.

Further, the electric mower according to an embodiment of the invention is equipped with the housing.

With the housing in which ventilation property and waterproof property are secured, the electric mower can maintain operation accuracy of parts such as electronic components mounted in the housing, and excellent mowing operation can be maintained.

DESCRIPTION OF EMBODIMENTS

[Basic Configuration of Electric Mower]

An embodiment of a work vehicle according to the present invention will be described. Unless otherwise specified, the term "front" means forward with respect to the front-rear direction of a vehicle body (traveling direction), and "rear" means rearward with respect to the front-rear direction of the vehicle body (traveling direction) herein. Further, the left-right direction or the lateral direction means the transverse direction of the vehicle body (vehicle body width direction) orthogonal to the front-rear direction of the vehicle body. "Upper" or "lower" is a positional relation with the vertical direction (perpendicular direction) of the vehicle body and means a relation to height above ground level.

Figure 1:
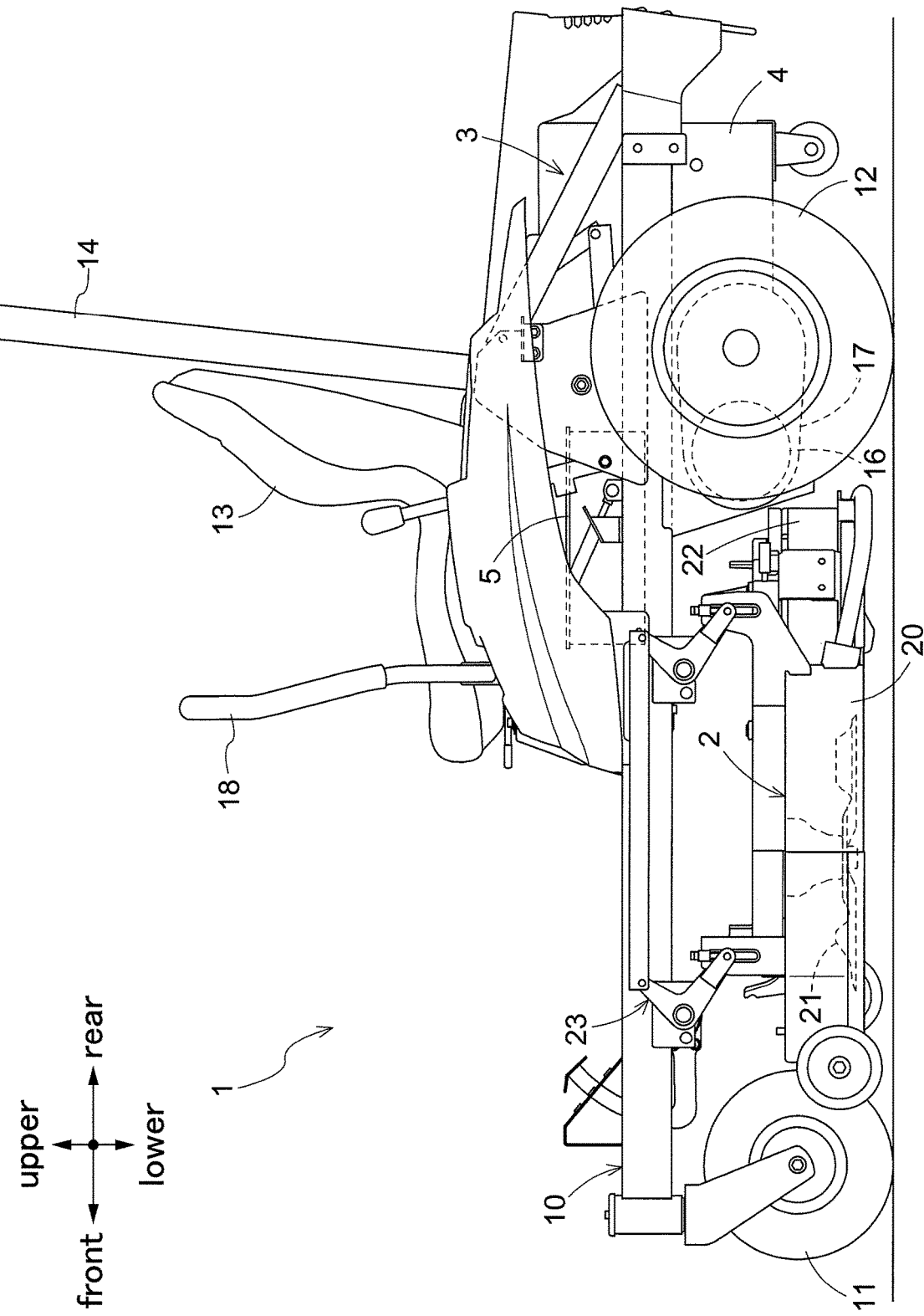
FIG. 1 is a left side view of an electric mower.
Figure 2:
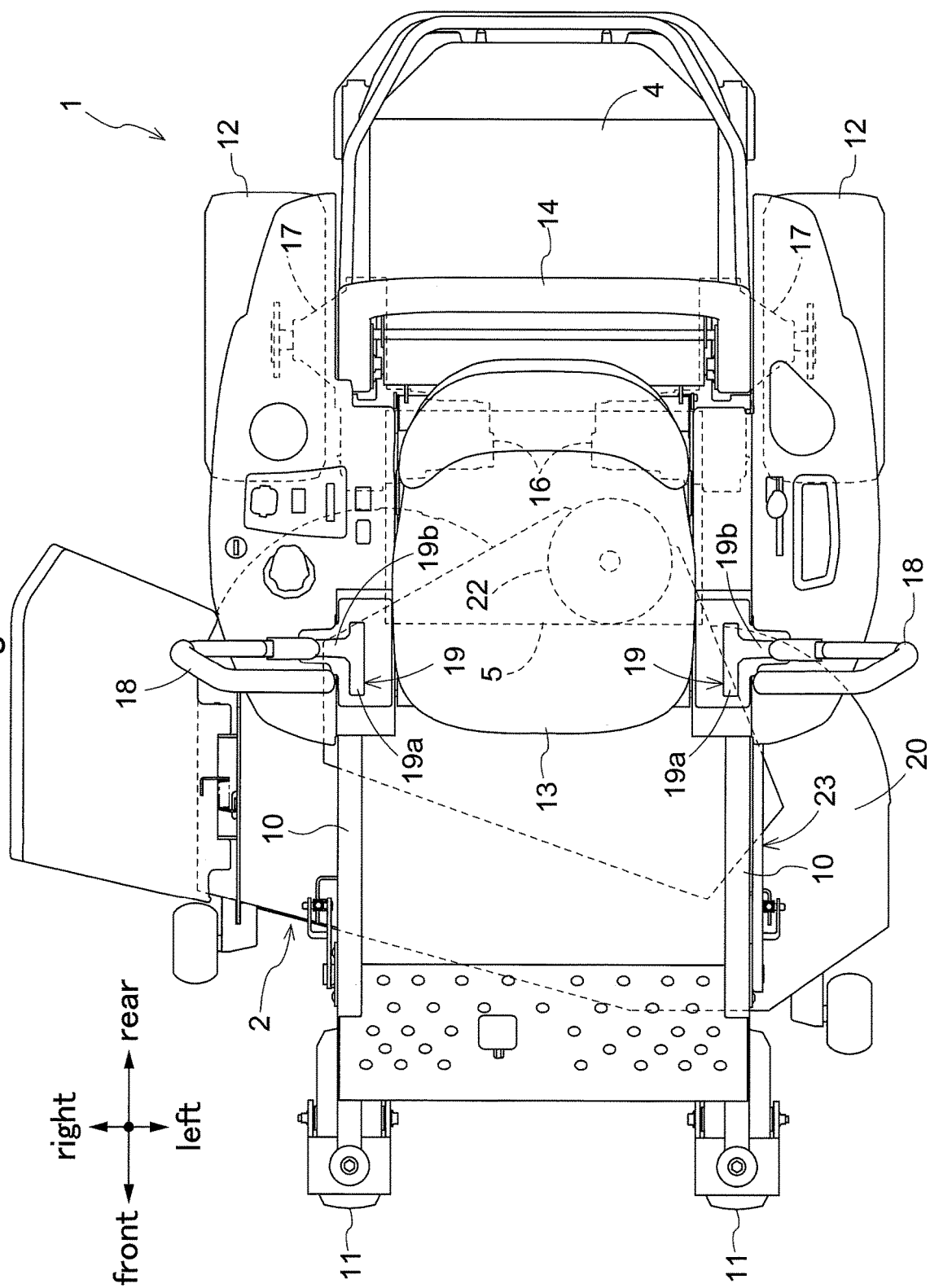
FIG. 2 is a plane view of an electric mower.

In FIG. 1 and FIG. 2, an electric mower is shown as an example of work vehicle. The electric mower includes a vehicle body 1, a pair of right and left front wheels 11, 11, a pair of right and left rear wheels 12, 12, a mower unit 2, and a battery storage unit 3. The pair of right and left front wheels 11, 11 are disposed in a front part of the vehicle body 1, and the pair of right and left rear wheels 12, 12 are disposed in a rear part of the vehicle body 1. The mower unit 2 is supported between the pair of right and left front wheels 11, 11 and the pair of right and left rear wheels 12, 12, in a front-rear direction and a left-right direction in a lower part of the vehicle body 1. The battery storage unit 3 is supported between the pair of right and left rear wheels 12, 12 in the rear part of the vehicle body 1.

The vehicle body 1 includes a frame 10. A driver's seat 13, on which a worker sits, a ROPS frame 14, and the like are disposed in the upper part of the vehicle body 1. The driver's seat 13 is supported by the frame 10, and the lower part of the ROPS frame 14 is connected to the frame 10.

A pair of right and left travel motors 16, 16 and a pair of right and left speed-reduction mechanisms 17, 17 are disposed in a rear part of the frame 10. Power of the travel motor 16 on the right side of the machine body (vehicle body 1) is transmitted to the rear wheel 12 on the right side of the machine body via the speed-reduction mechanism 17 on the right side of the machine body. Further, power of the travel motor 16 on the left side of the machine body is transmitted to the rear wheel 12 on the left side of the machine body via the speed-reduction mechanism 17 on the left side of the machine body.

A pair of right and left steering levers 18, 18 are respectively disposed on both right and left sides of the driver's seat 13. Each steering lever 18 is operated within a range of a predetermined operation path 19. The operation path 19 consists of an operation path for traveling 19a and an operation path for stop 19b. The operation path for traveling 19a is configured to have a path for operating a speed in moving forward and a path for operating a speed in moving rearward which are arranged in the front-rear direction of the machine body with a neutral position located therebetween at a center. The operation path for stop 19b contacts with the operation path for traveling 19a at the neutral position and is oriented in the left-right direction of the machine body. Regarding the operation path for stop 19b, the steering lever 18 on the right side of the machine body is operable along the operation path for stop 19b extending from the neutral position to the right side. The steering lever 18 on the left side of the machine body is operable along the operation path for stop 19b extending from the neutral position to the left side. When a worker operates the steering lever 18 on the right side of the machine body to the neutral position, the travel motor 16 on the right side of the machine body stops. When the worker operates the steering lever 18 on the right side of the machine body to the moving forward side, the travel motor 16 on the right side of the machine body rotates in a direction to move the vehicle forward. When the worker operates the steering lever 18 on the right side of the machine body to the moving rearward side, the travel motor 16 on the right side of the machine body rotates in a direction to move the vehicle rearward. When the worker shifts the steering lever 18 on the right side of the machine body from the neutral position to the right side up to the end part of the operation path for stop 19b, a parking brake (corresponding to "brake") of the rear wheel 12 on the right side of the machine body becomes a braking state. Also, when the worker operates the steering lever 18 on the left side of the machine body to the neutral position, the moving forward side, the moving rearward side, and the left end part-side of the operation path for stop 19b, the travel motor 16 on the left side of the machine body is operated similarly to the above description. With the above, the travel motor 16 is configured to drive the rear wheel 12 as a traveling wheel. That is to say, the worker operates the right and left steering levers 18, 18 independently, thereby driving the respective right and left rear wheels 12, 12 independently. As a result, the electric mower is capable of traveling and turning.

The mower unit 2 includes a housing unit 20, a cutting blade 21, cutting blade motor 22, and a link mechanism 23. A lower part of the housing unit 20 is opened downward, and the cutting blade 21 and the cutting motor 22 are held in the housing unit 20. Therefore, the front, rear, left, right and upper sides of the cutting blade 21 are covered with the housing unit 20. The cutting blade 21 is rotatable about a vertical axis inside the housing unit 20 by power of the cutting motor 22. The housing unit 20 is elevatably suspended from the frame 10 by the link mechanism 23.

As described above, the battery storage unit 3 is disposed in the rear part of the vehicle body 1, and the battery storage unit 3 is configured to hold the battery unit 4. The battery unit 4 is capable of supplying an electric power to the travel motor 16 and the cutting motor 22. Also, the electric mower is equipped with a housing 5 holding a variety of parts 15 such as electronic components and circuit boards including various control apparatuses. Any number of the housings 5 are mounted at any position in the vehicle body 1, for example below the driver's seat 13 and in the battery storage unit 3, or the like.

[Housing]

Figure 3:
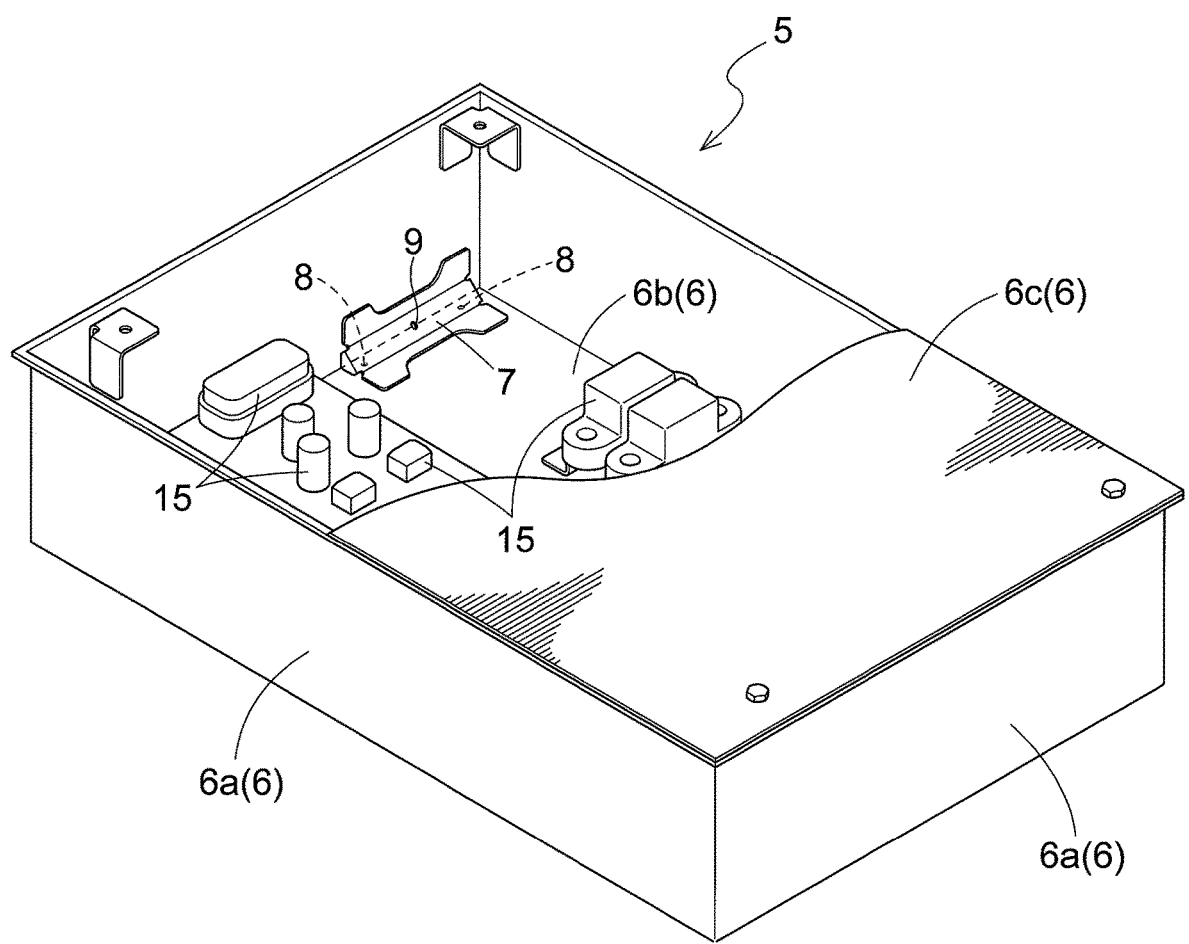
FIG. 3 is a perspective view showing a configuration example of a housing and a gutter member.

As shown in FIG. 3, the housing 5 has an enclosed space (corresponding to "first enclosed space") surrounded by outer circumferential plates 6, and for example, the outer shape of the housing 5 is a rectangular parallelepiped composed of the outer circumferential plates 6. The outer circumferential plates 6 include four side plates 6a, a bottom plate 6b, and a top plate 6c. The side plates 6a are vertically arranged on peripheral parts of an upper face of the bottom plate 6b which is a face on the side of the enclosed space. The top plate 6c is arranged on an opposite side to the bottom plate 6b across the side plates 6a, and the peripheral parts of the lower face of the top plate 6c, which is a face on the side of the enclosed space, contact with the side plates 6a. The bottom plate 6b serves as the bottom part of the housing 5 when in use.

A variety of parts 15 including electronic components such as inverters, relays, and resistances, electric components, harnesses, and others are held in the enclosed space of the housing 5.

Many of these parts 15 generate heat, and two outer holes 8 penetrating through the bottom plate 6b are formed in the bottom plate 6b of the housing 5 in order to secure ventilation property to the parts 15.

Working machines such as electric mowers are frequently operated outdoors, and occasionally washed with water. The housing 5 holds a lot of parts 15 such as electronic components which require waterproof property. Therefore, there is a need to prevent water and the like from entering the housing 5. As a result, there is a need for the housing 5 to secure both ventilation property and waterproof property.

The housing 5 has the outer holes 8, thereby securing ventilation property. However, water may enter the enclosed space of the housing 5 from the outer holes 8. Therefore, the housing 5 is equipped with the gutter member 7 surrounding the outer hole 8.

Figure 4:
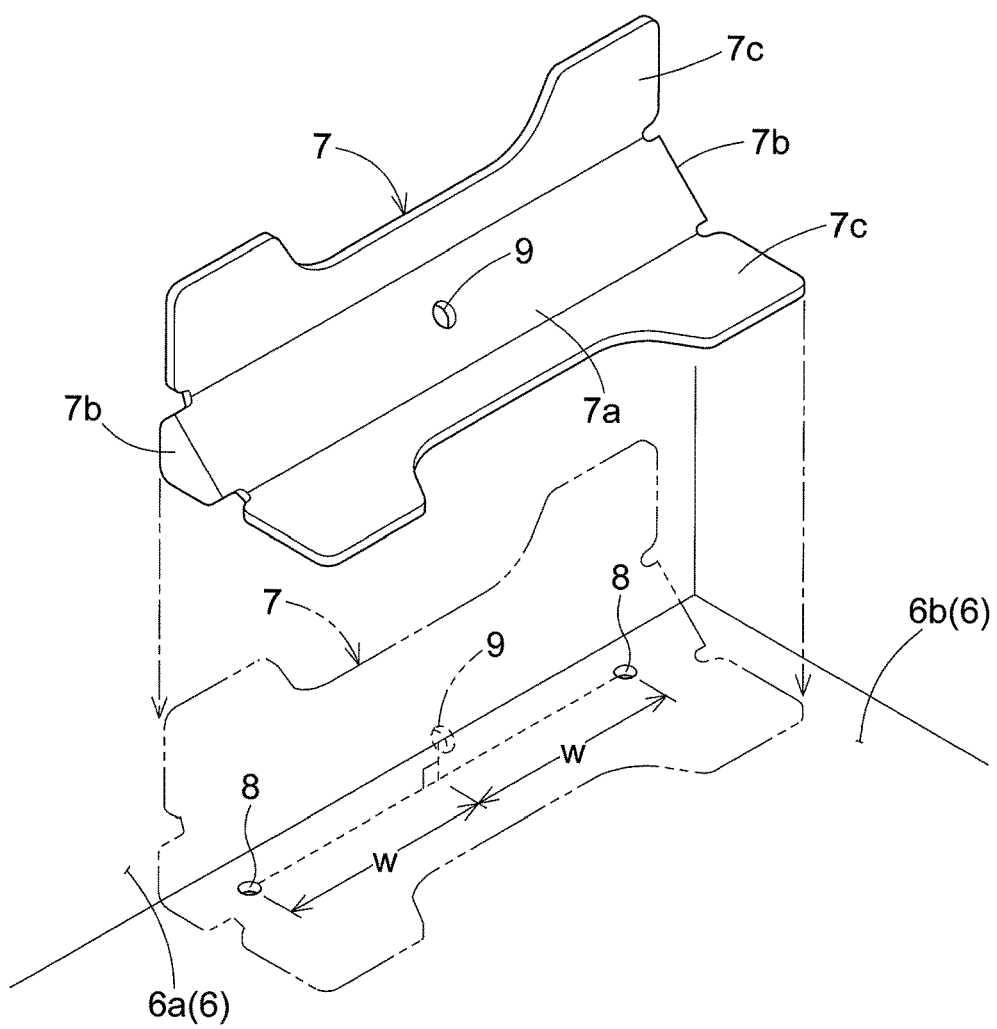
FIG. 4 is an exploded perspective view showing a configuration example of a gutter member.

As shown in FIG. 3 and FIG. 4, the gutter member 7 is disposed in the enclosed space of the housing 5 while contacting with the outer circumferential plate 6, forming another enclosed space (corresponding to "second enclosed space") by the gutter member 7 and the outer circumferential plates 6. The gutter member 7 is composed of a main body 7a, two cover plates 7b, and an inner hole 9 formed in the main body 7a. The main body 7a is disposed over one of the side plates 6a and the bottom plate 6b. The cover plates 7b are disposed in contact with the respective side faces of the main body 7a, the bottom plate 6b, and the side plate 6a contacting with the main body 7a. With respect to the gutter member 7, the enclosed space is formed by the main body 7a, two cover plates 7b, the bottom plate 6b, and the side plate 6a contacting with the main body 7a. The gutter member 7 is disposed in the housing 5 so that the two outer holes 8 commute with the enclosed space formed by the gutter member 7. Further, the main body 7a is equipped with two connecting parts 7c which are in surface contact with the bottom plate 6b and the side plates 6a respectively. It is preferable to paint the interior of the enclosed space of the housing 5 in a state of the gutter member 7 being disposed, because, even if there is a minute clearance at the boundary portion between the gutter member 7 and the outer circumferential plate 6, the clearance is filled with a paint and sealability of the enclosed space is improved.

The inner hole 9 is formed in the main body 7a of the gutter member 7 to penetrate through the main body 7a. In a plane view in which the surface of the bottom plate 6b in the enclosed space is seen from above (on a gutter member 7-side), the inner hole 9 is located on the perpendicular line of the bottom plate 6b which passes near the middle point of the line segment that links the two outer holes 8 (in the drawing, both the distances from the two outer holes 8 to the middle point are expressed with a character "w").

With this configuration, ventilation property between the outside of the housing 5 and the inside of the housing 5 is secured via the outer holes 8, the enclosed space of the gutter member 7, and the inner hole 9. Also, water entering from the outer holes 8 tends to stay in the enclosed space of the gutter member 7 temporarily without entering the inside of the housing 5 through the inner hole 9, because the outer holes 8 and the inner hole 9 are provided to be offset. Water in the enclosed space of the gutter member 7 is discharged outside the housing 5 from at least one of the two outer holes 8. In particular, since the outer holes 8 are formed in the bottom plate 6b, water hardly enters the inside of the housing 5 through the inner hole 9 against gravity and tends to be discharged from the outer holes 8 under the influence of gravity. As a result, waterproof property of the parts 15 in the housing 5 can be effectively secured with the simple configuration. From the above, with the presence of the gutter member 7, ventilation property and waterproof property of the housing 5 can be secured.

Figure 5:
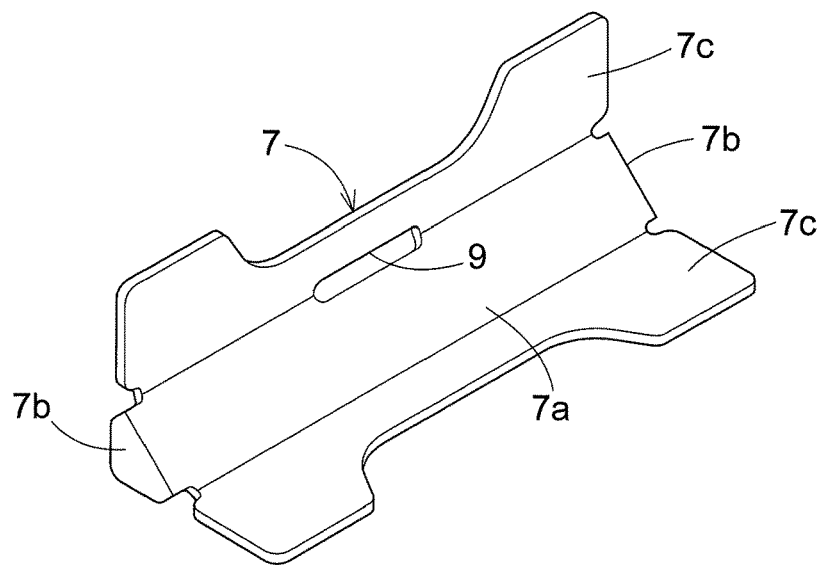
FIG. 5 is a perspective view showing a configuration example of a gutter member of another embodiment.

OTHER EMBODIMENTS (1) The shape of the inner hole 9 can be a variety of shapes such as round, ellipse, quadrangle, and any polygon forms. For example, as shown in FIG. 5, the inner hole 9 may be a slit (elongated hole) extending along a boundary line between the main body 7a and the side plate 6a. When the inner hole 9 having a constant opening area is supposed, and the inner hole 9 having a round shape and the inner hole 9 having a horizontally long slit are compared, the height of the slit is shorter than the diameter of the round shape, and therefore passing of water through the inner hole 9 is further suppressed and waterproof property can be improved.

(2) In each of the embodiments described above, the inner hole 9 may be provided at a position offset from all the outer holes 8 in a plane view with respect to the plane parallel to the bottom plate 6b, and may not be near the middle point between the outer holes 8. When the inner hole 9 is provided to be offset from the outer holes 8, water that has entered the enclosed space of the gutter member 7 does not easily enter the inside of the housing 5 through the inner hole 9, and waterproof property is secured. For example, in a plane view with respect to the plane parallel to the bottom plate 6b, when the outer holes 8 are displaced to one side in the longitudinal direction of the gutter member 7 and the inner hole 9 is displaced to the other side, the inner hole 9 and the outer holes 8 are provided to be offset sufficiently.

(3) In each of the embodiments described above, the number of the provided outer holes 8 may be three or more, not limited to two. Also, the number of the provided inner holes 9 may be two or more, not limited to one. In such a case, when all the inner holes 9 are provided at positions offset from all the outer holes 8, entering of water into the inside of the housing 5 is prevented and waterproof property is secured while ventilation property is secured.

Also, by disposing a plurality of the inner holes 9 and making each of the inner holes 9 smaller, passing of water through each of the inner holes 9 becomes difficult and waterproof property is also secured while ventilation property is secured.

(4) In each of the embodiments described above, the outer holes 8 are provided in the bottom plate 6b, but the positions of the outer holes 8 are not limited to this, and at least one of the outer holes 8 may be provided in the side plates 6a. In such a case, it is preferable that the levels of all the outer holes 8 from the bottom plate 6b are lower than the level of the inner hole 9 from that. By disposing the outer holes 8 at a lower position than the inner hole 9, entering of water into the inside of the housing 5 is sufficiently prevented and waterproof property is secured.

(5) In each of the embodiments described above, the gutter member 7 is disposed over one of the side plates 6a and the bottom plate 6b but the plates to which the gutter member 7 is provided are not limited to these, and the gutter member 7 may be disposed over the two adjacent side plates 6a and the bottom plate 6b. Also, the gutter member 7 may be disposed on only either one of the side plate 6a or the bottom plate 6b. By disposing the gutter member 7 at a desired peripheral part inside the housing 5, the gutter member 7 can be disposed at an optimal position depending on the arrangement construction of the parts 15, and optimizing the size of the housing 5 is facilitated. Also, a plurality of the gutter members 7 may be disposed inside the housing 5. By disposing a plurality of gutter members 7, ventilation property of the housing 5 can be improved while waterproof property is secured.

What is claimed is:

1. A housing for holding parts comprising:
    a plurality of outer circumferential plates connected with each other to form a first enclosed space, the two adjacent outer circumferential plates having a total of two or more outer holes formed therein; and
    a gutter member connected to at least two outer circumferential plates, the gutter member having an inner hole formed therein;
    wherein:
    the gutter member is disposed over the two adjacent outer circumferential plates,
    the two adjacent outer circumferential plates and the gutter member form a second enclosed space, and
    the inner hole is provided to be offset from the outer hole when viewed along a direction perpendicular to a surface of the gutter member in which the inner hole is formed.

2. The housing according to claim 1, wherein the outer holes are formed in the outer circumferential plate which serves as a bottom plate when the housing is in use.

3. The housing according to claim 1, wherein the outer holes are two holes provided in one of the outer circumferential plates, and
    the inner hole is provided near a middle point between the two outer holes when viewed from a plane parallel to the outer circumferential plate in which the outer holes are formed.

4. The housing according to claim 1, wherein the inner hole is an elongated hole along a contacting line between the outer circumferential plate and the gutter member.

5. The housing according to claim 1, wherein a plurality of the gutter members are provided to form the second enclosed spaces, the respective outer holes communicate with the second enclosed spaces and the respective inner holes communicate with the second enclosed spaces.

6. An electric mower, wherein parts are stored in the housing according to claim 1.

* * * * *